356-138. SR 3-11-75 OR 3,870,416

United States Patent [19]

Brady et al.

[11] 3,870,416

[45] Mar. 11, 1975

[54] WAFER ALIGNMENT APPARATUS

[75] Inventors: Kevin James Brady, Murray Hill; Victor Andrew Firtion, Secaucus; Leif Rongved, Summit; Thomas Edward Saunders, Basking Ridge, all of N.J.

[73] Assignee: Bell Telephone Laboratories, Incorporated, Berkeley Heights, N.J.

[22] Filed: Jan. 9, 1974

[21] Appl. No.: 432,082

[52] U.S. Cl. ................. 356/138, 356/153, 356/172, 108/104, 248/17

[51] Int. Cl. ........................................ G01b 11/26

[58] Field of Search ........... 356/138, 150, 153, 172; 248/17, 399; 108/104, 139; 269/71, 73

[56] References Cited

UNITED STATES PATENTS 3,266,758 8/1966 Ormond ........................... 248/17 X

*Primary Examiner*—Ronald L. Wibert
*Assistant Examiner*—Paul K. Godwin
*Attorney, Agent, or Firm*—R. B. Anderson

[57] ABSTRACT

A wafer alignment device comprises a support platform supported by three flexible rods extending downwardly to a linking ring. Three flexible rods extend upwardly from the linking ring to a stationary table. The support platform can be moved in $x$, $y$ and $\theta$ directions, to align the wafer with great accuracy and without accompanying $z$-direction motion, for photolithographic printing purposes.

9 Claims, 6 Drawing Figures

WAFER ALIGNMENT APPARATUS

BACKGROUND OF THE INVENTION

This invention relates to alignment apparatus, and more particularly, to apparatus for accurately registering the circuit pattern of a semiconductor wafer with certain reference markings.

The copending application of M. Feldman and M. C. King, Ser. No. 227,275, filed Aug. 2, 1972; now U.S. Pat. No. 3,801,593 and assigned to Bell Telephone Laboratories, Incorporated, describes a photolithographic printing technique particularly applicable to the fabrication of semiconductor devices. A semiconductor wafer, covered with a photosensitive film, and a mask of the circuit to be made, are mounted on a common movable translation table. Only a small portion of the mask is imaged onto the film by a high resolution, small image field optical system. The translation table is then reciprocated in an $x$-direction and periodically stepped in a $y$-direction to give raster scanning of the sensitized wafer by the projected mask image. This permits printing of an entire mask pattern through the use of a lens system having an image field area much smaller than the area of the pattern to be printed, thereby giving higher resolution and printing accuracy than could ordinarily be obtained.

The mask pattern to be printed on the wafer surface must usually be aligned with other patterns already existing on the wafer surface. This of course requires a precise registration of the mask with respect to the wafer, which, as described in the M. Feldman, et al., application, may be accomplished by projecting the wafer image onto the mask, observing the superimposed mask and wafer images, and then moving the wafer to bring it into proper registration with the mask pattern. Because the registration accuracy requirements of this system are much higher than those previously encountered, the mechanical problems of registering the wafer with the mask pattern are quite pronounced. Conventional bearing surfaces do not permit smooth adjustment of the wafer position with the micron and submicron accuracies required. Even more importantly, the high-resolution lens system has such a limited depth of field that minute vertical displacements of the wafer throw the projected image out of focus.

SUMMARY OF THE INVENTION

Accordingly, it is an object of this invention to improve the accuracy and smoothness with which objects may be moved horizontally through small distances without vertical movement.

More specifically, it is an object of this invention to improve the smoothness and accuracy with which a semiconductor wafer can be aligned with a projected registration mark, while keeping the wafer within a very limited depth of field.

These and other objects of the invention are attained in an illustrative embodiment for supporting the wafer to be aligned. Three flexible rods extend downwardly from a support platform to a linking ring, and three other identical flexible rods extend upwardly from the linking ring to a stationary table. It has been found that, with this structure, the platform can be moved in $x$, $y$ and $\theta$ directions, in the micron and submicron range, with smoothness and accuracy. This movement involves neither sliding nor rolling friction, nor does the device have any bearing surfaces, but rather, it relies on slight flexures of the flexible rods. While the linking ring moves vertically during alignment, the platform does not, thus maintaining the wafer within the depth of field and at the proper magnification of the lens system.

As will be explained later, the forces required to move the platform in the $x$, $y$ and $\theta$ directions are applied to a rigid positioning member extending downwardly from the platform, and are preferably applied at a plane located halfway between the platform and the support ring. Electronically driven transducers of a type known in the art are preferably used to apply the forces to the positioning member needed for the minute displacements of the support platform.

These and other objects, features and advantages of the invention will be better understood from a consideration of the following detailed description taken in conjunction with the accompanying drawing.

DRAWING DESCRIPTION

DETAILED DESCRIPTION

Figure 1:
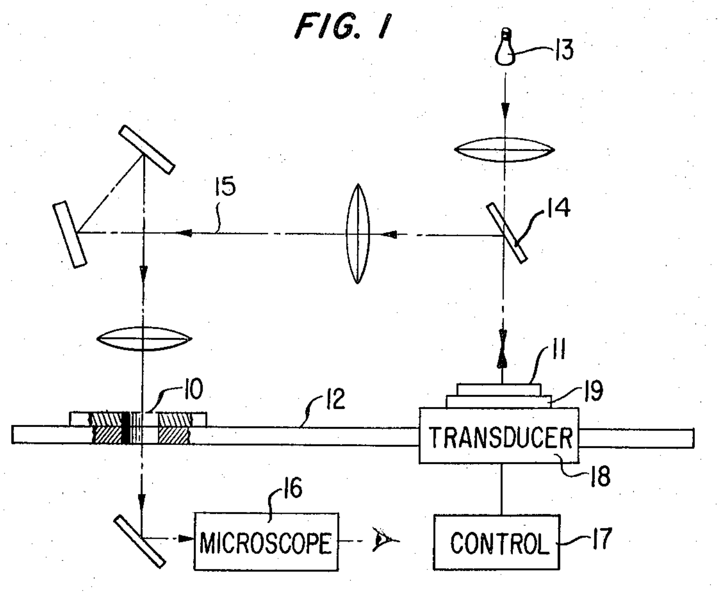
FIG. 1 is a schematic representation of part of a scanning projection printer in which a wafer is aligned with a mask pattern in accordance with the invention.

Referring now to FIG. 1 there is shown part of a scanning projection printer of the general type described in the aforementioned copending application of M. Feldman, et al. As described in that application, a photolithographic mask 10 and a semiconductor wafer are mounted on a common table 12 which is subsequently moved in a raster scan fashion so that the entire mask pattern is printed on the photosensitive film covering the wafer. However, prior to photolithographic printing, it is necessary to align precisely the wafer with the mask; or, more particularly, it is necessary to register patterns on the wafer with patterns on the mask.

The alignment step is accomplished by projecting non-actinic light from a source 13 through a partially transparent mirror 14 onto the wafer 11, with the light subsequently following optical path 15 so that the wafer pattern is imaged on mask 10. The superimposed wafer image and mask pattern are then observed through a microscope 16. Markings on the wafer surface are typically aligned with registration marks in the mask through the use of control apparatus 17 which actuates a transducer 18 to move a support platform 19 upon which the wafer is mounted; that is, during observation, the support platform 19 is moved in $x$, $y$ and $\theta$ directions to bring the wafer pattern into precise registration with the mask pattern.

Since the scanning projection printer is capable of printing the patterns with micron and submicron accuracy, it is necessary that the wafer alignment be performed with a corresponding accuracy. One problem encountered in such alignment is the limited depth of field of the optical components, which necessarily results from the use of extremely high resolution lenses.

Thus, any spurious vertical movement will throw the wafer pattern out of focus; in the apparatus we have been testing it is necessary during alignment to keep any vertical displacement of the wafer at less than one micron. Further, submicron movements of the wafer must be made with a high degree of control accuracy and smoothness. Conventional bearing surfaces are not sufficiently responsive and predictable and they are incapable of maintaining spurious vertical displacements at a sufficiently low value.

Finally, after alignment has taken place, the table is moved in a raster scan fashion to give scanning projection printing of the mask pattern on the wafer with appropriate actinic light as described in the M. Feldman, et al., application. Thus, another requirement of transducer 18 and support platform 19 is that they must be sufficiently rugged to withstand the rapid scanning movement, which places additional constraints on bearing surfaces that may be used during alignment.

Figure 2:
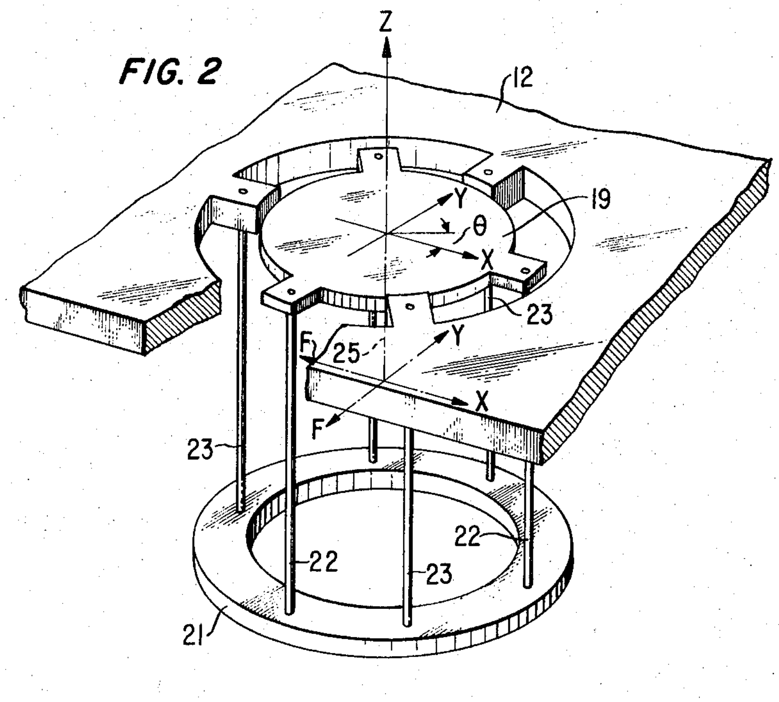
FIG. 2 is a schematic representation of a wafer alignment device in accordance with one embodiment of the invention.

Referring to FIG. 2 there is shown a schematic embodiment of the invention comprising a support platform 19 attached to the table 12, which, for purposes of this discussion, will be considered to be stationary. The purpose of the FIG. 2 device is to permit the support platform 19 to be moved smoothly and accurately in $x$, $y$ and $\theta$ directions, as shown without any significant movement in the $z$-direction.

The platform 19 is connected to a linking ring 21 by three symmetrically disposed rods 22. Rods 22 are flexible in the sense that they can be biased from side to side, but they provide substantial longitudinal support; that is, they are capable of flexure, but they have considerable tensile and compressive stiffness. The linking ring 21 is connected to the stationary table by three symmetrically disposed rods 23 which are preferably identical in structure to rods 22.

With this structure, the platform 19 can be displaced in $x$, $y$ and $\theta$ directions without any accompanying vertical motion. Since there are no rolling or sliding surfaces involved, movement is smooth and accurate and unaffected by dust particles or other contaminants. The displacements of course result in a slight bending of the flexible rods 22 and 23 which affecgs their net vertical length; this difference, however, is manifested by vertical movement of the linking ring 21 rather than support platform 19.

To provide virtually complete elimination of spurious vertical displacements of the supported wafer, it can be shown that the forces applied to displace table 19 should be applied at a vertical location corresponding to the midpoints of rods 22 and 23. Thus, forces labeled F are applied in the $x$, $y$ and $\theta$ directions through a rigid positioning member schematically shown as 25.

Assuming that each rod 22 and 23 is symmetrical and fixed at both ends, the midpoints of the rods are inflection points at which the rod curvature goes through zero. Applying forces at the plane of these inflection points will avoid spurious torque components on the support platform 19 that would tend to make it rotate about the $x$ or $y$ axes, which would give motion in the $z$-direction. The forces F should of course be applied horizontally and, as will be explained later, are preferably applied to a hollow cylinder extending downwardly from the support platform.

It can intuitively be appreciated that the structure should be generally symmetrical. Rods 22 are preferably spaced at 120° with respect to each other, as are rods 23, with all rods having substantially identical characteristics. After the adjustment has been made, the platform should be locked in place since it is thereafter reciprocated back and forth; as will be explained later, piezoelectric transducers for applying forces F can also be used to lock the position of the platform 19. The ring 21 is preferably located in a reservoir of viscous fluid to damp vibrations during the adjustment and scanning.

Figure 3:
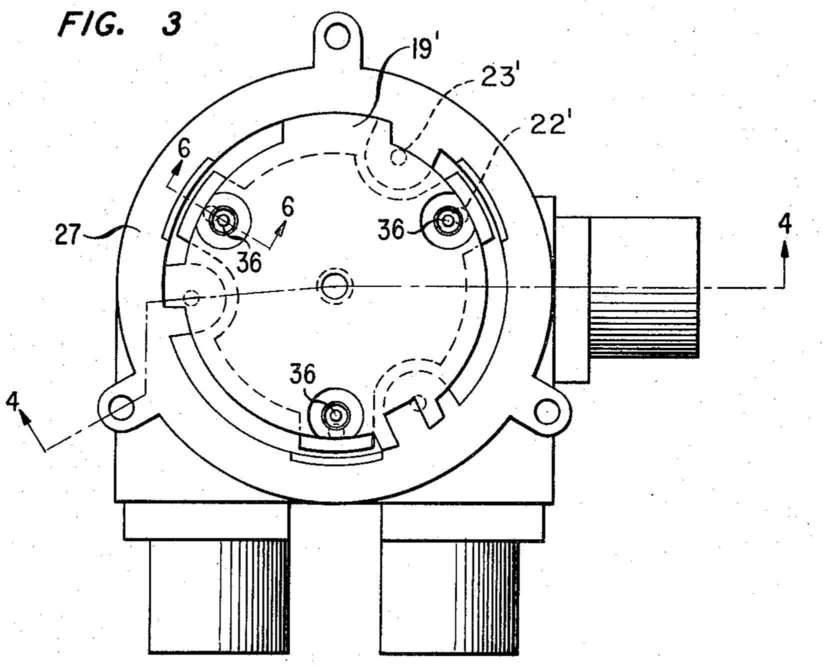
FIG. 3 is a plan view of a wafer alignment device in accordance with another embodiment of the invention.
Figure 4:
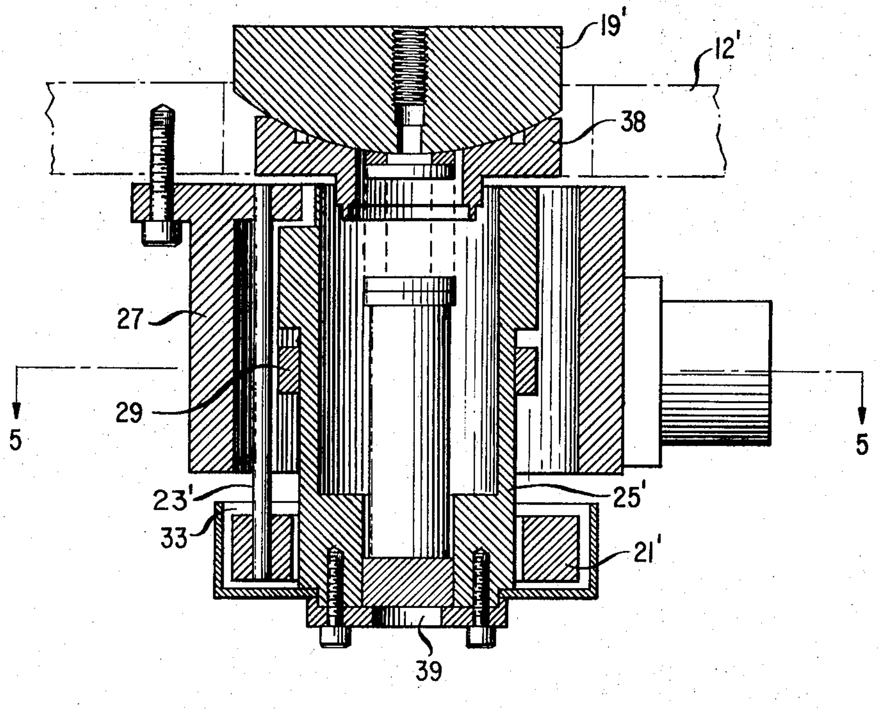
FIG. 4 is a view taken along lines 4—4 of FIG. 3.
Figure 5:
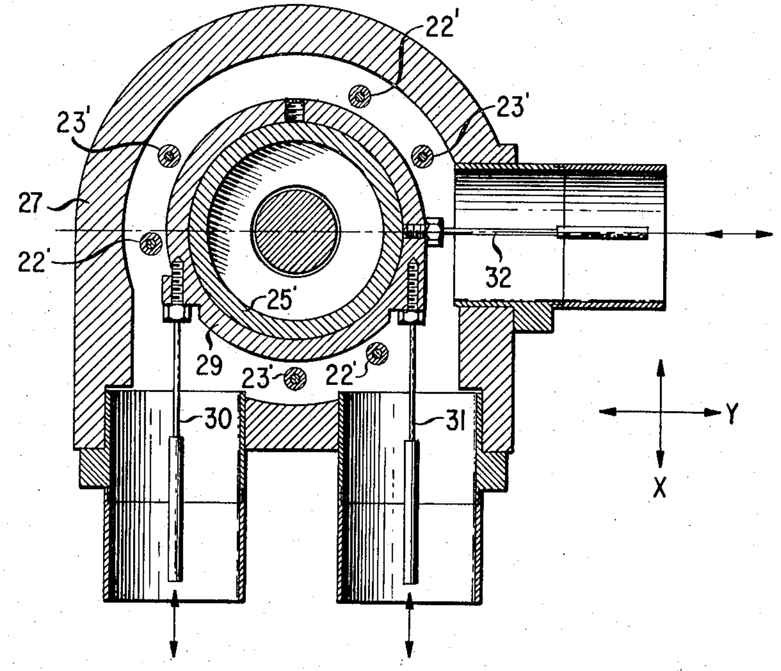
FIG. 5 is a sectional view taken along lines 5—5 of FIG. 4.

Referring to FIGS. 3 through 6 there is shown a more detailed illustration of an illustrative embodiment of the invention comprising a support platform 19' upon which the wafer is mounted. The support table is part of an assembly including a housing 27 which is bolted to support table 12' as shown in FIG. 4. Rods 22' and cantilever rods 23' are best shown in FIG. 5.

The mounting platform 19 is supported by a support cylinder 25'. The connections of rods 22' to support cylinder 25' are equivalent to the connection to the support platform 19 of FIG. 2, while the connection of rods 23' to housing 27 is equivalent to a connection to the main table 12 of FIG. 2.

The displacement forces are applied to a ring 29 of cylinder 25' (which performs the function of rigid positioning member 25 of FIG. 2) and are applied through flexure rods 30, 31 and 32 shown in FIG. 5. The flexure rods are similar to rods 22' and 23' in that, while capable of curvature, they have high tensile and compressive stiffness. Each is attached at one end to a piezoelectric transducer (not shown) which drives it in or out as shown by the arrows. If it is desired to displace the wafer in the $y$ direction, rod 32 is driven in or out. To displace the wafer in the $x$-direction, rods 30 and 31 are driven together simultaneously. To give a $\theta$ displacement, rods 30 and 31 are driven in opposite directions. it is of course important that rods 30, 31 and 32 have flexure capabilities so that certain rods may curve while other rods are being driven. Referring to FIG. 4, the linking ring 21', to which the rods 22' and 23' are connected, is located in a reservoir 33 of viscous fluid for damping vibrations during alignment adjustment and scanning. The fluid is preferably a thick silicone solution.

Figure 6:
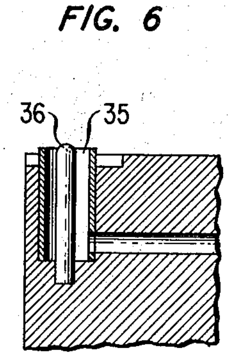
FIG. 6 is a view taken along lines 6—6 of FIG. 3.

Referring to FIG. 3, which is a plan view of the assembly, the support platform 19' is a form of vacuum chunk having three openings 35 which hold the wafer in place by vacuum suction. Referring to FIG. 6, a small pin 36 is located in the center of each opening 35 and protrudes slightly above its surface to bear against the wafer. It has been found that such construction minimizes wafer distortion caused by vacuum suction. This is an important consideration because slight wafer distortion can take the wafer out of focus for the reason described before.

The embodiment shown in FIGS. 3 through 6 is capable of providing $x$, $y$ and $\theta$ adjustments to a ± 0.1 micron over ranges of ± 650 microns (0.025 inches). These displacements are made while maintaining a constant vertical position of the entire wafer surface to within ± 0.5 microns. Interferometer measurements have shown that maximum displacements of the wafer have resulted in a maximum spurious tilting of approximately one arc second, which corresponds to a maximum $z$ displacement of ± 0.18 microns at the edges of a 3-inch wafer.

Through the use of a piezoelectric transducer, the displacements are found to be electrically controllable with great accuracy and smoothness. Piezoelectric transducers are known devices in which electrical signals are applied to piezoelectric material so as to cause the material to make minute displacements in a highly controllable manner. One commercially available transducer is known as the "Burleigh Inchworm, Model PZ-500" available from Burleigh Instruments, Incorporated, East Rochester, N.Y. Piezoelectric transducers are highly stable in the "off" condition, which means that, after adjustment, they will dependably lock the wafer into position.

Referring to FIG. 4 the support platform 19' is held in place by another vacuum chunk 38. Access for vacuum tubing is made through a central opening 39 in the assembly. A vertical adjustment transducer, which has not been shown, is also included in the central opening 39. The vertical adjustment transducer is part of a laser beam servomechanism for maintaining the vertical position of the wafer surface during operation as described in the aforementioned M. Feldman et al. application (see particularly FIG. 6).

The foregoing is intended to be merely illustrative of the inventive concepts involved. Various other embodiments and modifications may be made by those skilled in the art without departing from the spirit and scope of the invention.

What is claimed is:

1. Alignment apparatus comprising:

means for supporting an object to be aligned comprising a support platform;

a plurality of substantially parallel first rods extending from the support platform to a relatively movable linking member;

a plurality of second rods substantially parallel to the first rods extending from the linking member to a relatively stationary table member; and means for adjusting the orientation of the support platform while observing the object, thereby to align the object with a reference.

2. The apparatus of claim 1 wherein:

the support platform has an upper surface lying in an $x$-$y$ plane;

and the first and second rods all extend substantially in a $z$-direction perpendicular to the $x$-$y$ plane.

3. The apparatus of claim 2 further comprising:

a positioning member connected to the support platform and extending in the Z-direction;

and wherein the adjusting means comprises means for applying forces to the positioning member at a vertical location substantially midway between the support platform and the linking member.

4. The apparatus of claim 3 wherein:

the linking member comprises a ring along which the first rod connections and second rod connections are each substantially symmetrically distributed.

5. The apparatus of claim 4 wherein:

the adjusting means comprises means for displacing the positioning member in the $x$ direction, means for displacing the positioning member in the $y$ direction and means for applying displaced forces to the positioning member in opposite directions simultaneously to give an angular displacement to the platform.

6. The apparatus of claim 5 wherein:

the $x$-direction displacing means comprises two parallel, axially stiff, separated, flexible driver rods fixed to the positioning member;

the $y$-direction displacing means comprises one axially stiff flexible driver rod fixed to the positioning member;

and means for selectively driving the driver rods axially to give $x$, $y$ or $\theta$ displacement to the support platform.

7. The apparatus of claim 6 wherein:

the ring is located in viscous fluid for damping vibrations.

8. The apparatus of claim 7 wherein:

the displacements are produced by piezoelectric transducers.

9. A method for aligning a wafer pattern with a mask pattern comprising the steps of:

mounting the wafer on a support platform having a plurality of substantially parallel flexible first rods extending therefrom to a linking member, and a plurality of second rods substantially parallel to the first rods extending vertically upwardly from the linking member to a support table;

optically superimposing the mask and wafer patterns;

observing the superimposed patterns through a microscope;

applying horizontal forces so as to displace the platform and to align the wafer pattern with the mask pattern;

said horizontal forces being applied to a positioning member extending vertically downwardly from the platform, and being applied at a vertical location corresponding substantially to the midpoints of the first rods, thereby to avoid any vertical displacement of the support platform during the alignment process.

* * * * *